US009052187B2

(12) United States Patent
Komuta et al.

(10) Patent No.: US 9,052,187 B2
(45) Date of Patent: Jun. 9, 2015

(54) INSPECTION APPARATUS AND INSPECTION METHOD FOR SEMICONDUCTOR DEVICE

(71) Applicant: Kabushiki Kaisha Toshiba, Tokyo (JP)

(72) Inventors: Naoyuki Komuta, Oita (JP); Masatoshi Fukuda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 158 days.

(21) Appl. No.: 13/784,334

(22) Filed: Mar. 4, 2013

(65) Prior Publication Data

US 2013/0250298 A1    Sep. 26, 2013

(30) Foreign Application Priority Data

Mar. 21, 2012    (JP) .................................. 2012-064451

(51) Int. Cl.
| | |
|---|---|
| *G01B 11/00* | (2006.01) |
| *G01B 11/14* | (2006.01) |
| *G01B 11/26* | (2006.01) |
| *G01C 1/00* | (2006.01) |
| *G01B 11/27* | (2006.01) |
| *H01L 23/00* | (2006.01) |

(52) U.S. Cl.
CPC .............. *G01B 11/14* (2013.01); *G01B 11/272* (2013.01); *H01L 2224/8113* (2013.01); *H01L 24/75* (2013.01); *H01L 24/81* (2013.01); *H01L 2223/54426* (2013.01); *H01L 2224/0401* (2013.01); *H01L 2224/06155* (2013.01); *H01L 2224/16145* (2013.01); *H01L 2224/75753* (2013.01); *H01L 2225/06513* (2013.01); *H01L 2225/06541* (2013.01); *H01L 2225/06593* (2013.01)

(58) Field of Classification Search
None
See application file for complete search history.

(56) References Cited

U.S. PATENT DOCUMENTS 8,244,399 B2 *    8/2012    Maeda et al. ................. 700/213
2002/0028532 A1    3/2002    Tsunashima
(Continued)

FOREIGN PATENT DOCUMENTS

| JP | H03175647 A | 7/1991 |
|---|---|---|
| JP | 2001044247 A | 2/2001 |
| JP | 2004-273612 | 9/2004 |
| JP | 2006121120 A | 5/2006 |
| JP | 2007067315 A | 3/2007 |
| JP | 2010021411 A | 1/2010 |

(Continued)

OTHER PUBLICATIONS

Japanese Office Action dated Jun. 24, 2014, filed in Japanese counterpart Application No. 2012-064451, 7 pages (with translation).

*Primary Examiner* — Gordon J Stock, Jr.
(74) *Attorney, Agent, or Firm* — Patterson & Sheridan, LLP

(57) ABSTRACT

An apparatus relating to the manufacture of stacked semiconductor devices includes, for example, a first holding section configured to hold a first semiconductor device and a second holding section configured to hold a second semiconductor device. Additionally, a measuring section including an imaging device for acquiring images of the first and second semiconductor devices and a control section configured to control the holding sections to correct misalignment between the semiconductor devices. The control section is further configured to determine misalignment using the images of the first and second semiconductor devices when the images include a first alignment mark disposed proximate to an edge of the first semiconductor device and a second alignment mark disposed proximate to an edge of the second semiconductor device.

20 Claims, 18 Drawing Sheets

(56) References Cited

U.S. PATENT DOCUMENTS

2010/0252615 A1\* 10/2010 Suga et al. .................... 228/205
2012/0127485 A1   5/2012 Yamauchi

FOREIGN PATENT DOCUMENTS

| JP | 2011124523 A | 6/2011 |
| JP | 2011169816 A | 9/2011 |

\* cited by examiner

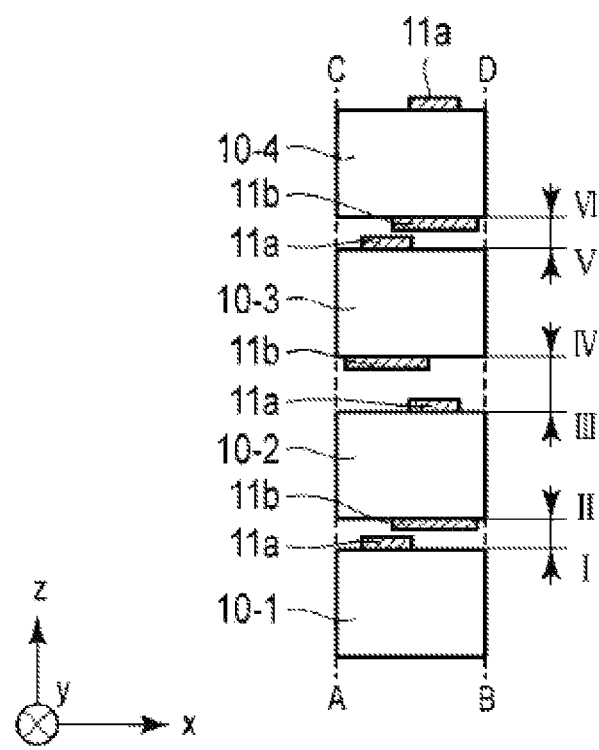

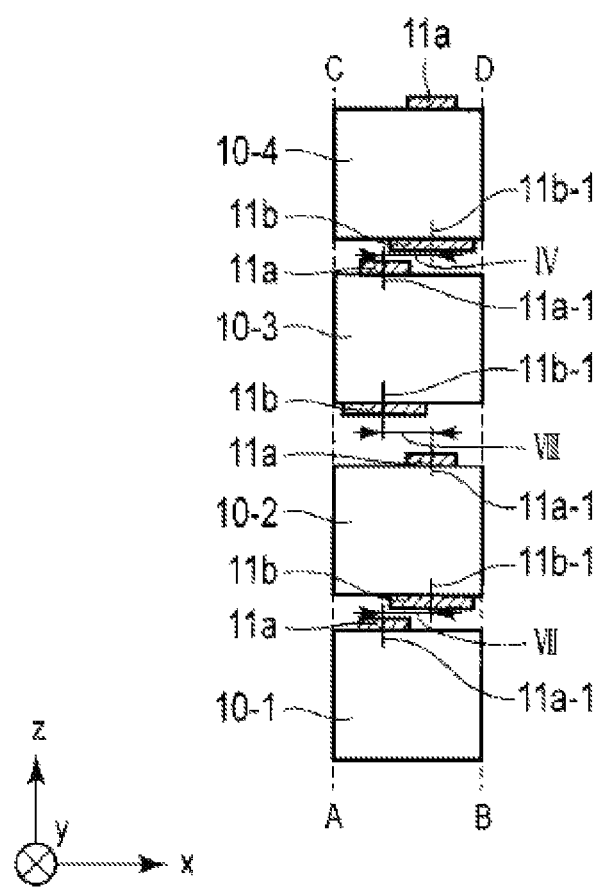

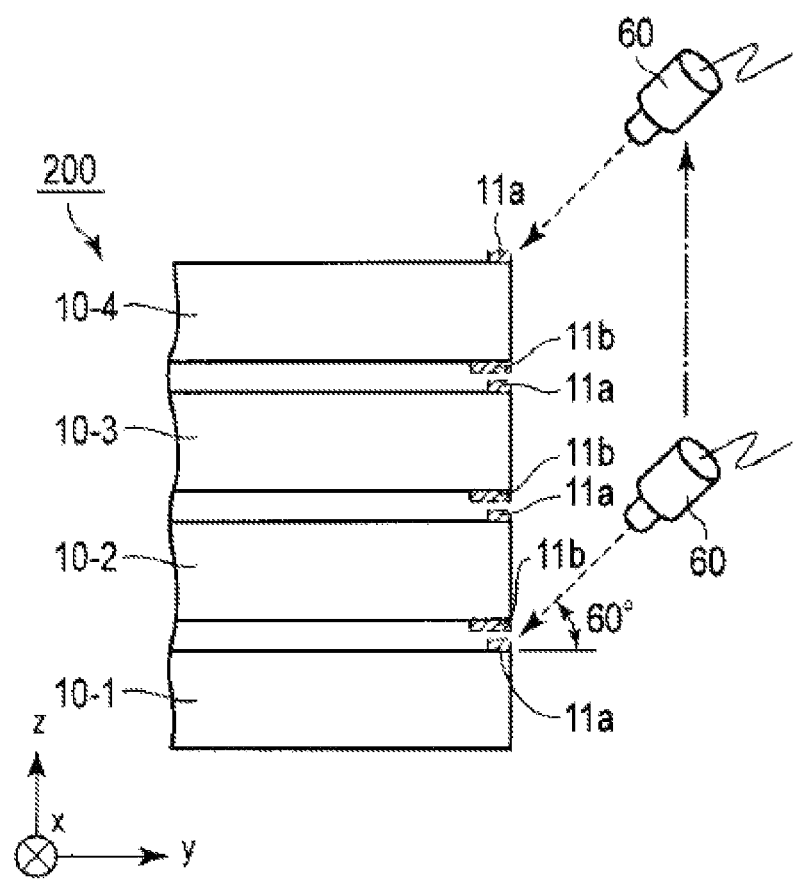

INSPECTION APPARATUS AND INSPECTION METHOD FOR SEMICONDUCTOR DEVICE

CROSS-REFERENCE TO RELATED APPLICATION

This application is based upon and claims the benefit of priority from Japanese Patent Application No. 2012-064451, filed Mar. 21, 2012, the entire contents of which are incorporated herein by reference.

FIELD

Embodiments described herein relate to an inspection apparatus and an inspection method for a semiconductor device.

BACKGROUND

Recently, semiconductor devices having a configuration wherein multiple semiconductor elements are stacked together have been developed. For such semiconductor devices, there are existing methods to measure misalignment between the semiconductor elements which involve making and imaging an alignment mark on each semiconductor element. However, using these alignment marks, which are located internally of the edges of the chip of die, is difficult when multiple die or chips are stacked one above the other for the solder or other bonding of the chips together.

There remains a need for an inspection apparatus and method which can effectively and efficiently determine alignment quality between semiconductor elements being assembled into a stacked or laminated semiconductor device.

DESCRIPTION OF THE DRAWINGS

FIG. 17 and FIG. 18 are diagrams schematically depicting images taken in the measuring section with a method described in association with FIG. 16.

FIG. 19B is a cross-sectional view of the semiconductor device in a case wherein an inspection angle of the measuring section according to the second embodiment is 60° for the x-axis-y-axis plane of the semiconductor chip.

DETAILED DESCRIPTION

Figure 1:
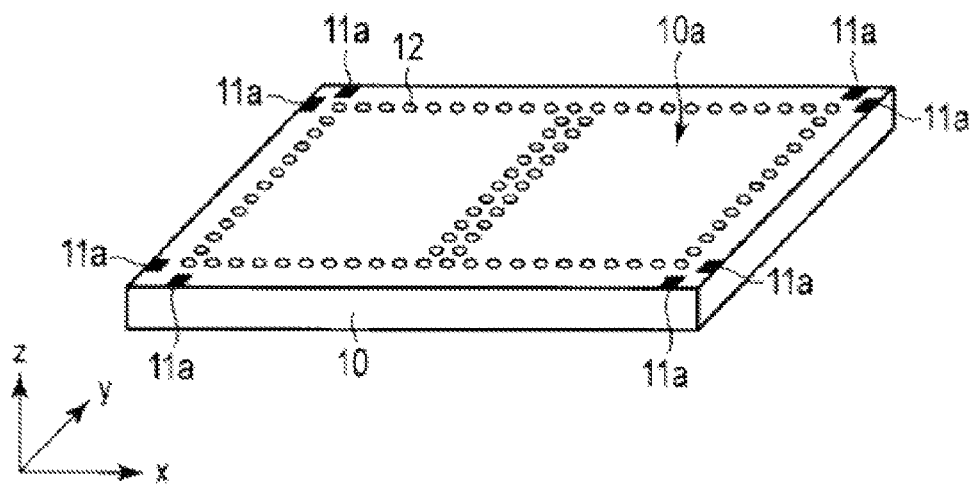
FIG. 1 is an overview schematically depicting a basic configuration of semiconductor elements according to a first embodiment.

The present disclosure describes an inspection and alignment apparatus for semiconductor devices, especially laminated or stacked devices that can be used in the manufacture of high-quality semiconductor devices. Various embodiments will be explained with reference to the figures. Furthermore, in the following explanation, the same reference numeral are given to the configuration elements having the same general function and configuration, and the repetitive explanation is omitted when possible. Moreover, each embodiment described below exemplifies, conceptually, a device and method according to the present disclosure. In general, the specific materials, shapes, configurations, etc. used in these embodiments are intended as examples and not intended as limitations. Various changes can be made to such details without altering and still be within the scope of the present disclosure.

Moreover, the provided figures are schematic representations, and such things as the depicted relationship between thickness and layer dimensions, as well as the ratio of thickness of each layer, generally differs from dimensions and ratios used physical embodiments. Therefore, specifics concerning thickness and other dimensions should be derived by referring the following explanation rather than direct measurement of the examples depicted in the figures.

As described herein, alignment mark preforms are formed to overlap the upper and lower surfaces of individual die on a wafer, prior to the singulation of the die from the wafer. The die are then singulated, cutting away both the die and the portion of the alignment mark preform extending between adjacent die, resulting in die having alignment marks formed on their upper and lower surfaces and abutting the edges thereof, and the resulting alignment mark locations are mated across the adjacent die. The alignment marks may be formed by depositing the alignment mark material through a mask to overlap adjacent die on a wafer, or, a blanket layer of the alignment mark material may be formed over the die and then etched away through a patterned mask to leave behind the alignment mark preforms. In either case, the precision of the mask provides relatively precise locating of the alignment mark preform form die to die, resulting in repeatable location of the alignment marks from die to die.

The alignment marks so formed enable precise locating of a stack of chips one above the other, such as in a stacked multi-chip device. With the alignment marks positioned adjacent to the edges of the opposed surfaces, the alignment marks may be visualized from the side of the wafers when a plurality of the chips are stacked one atop the other, and thus the precise alignment, or misalignment, of a plurality of chips in a stack may be used to improve the alignment of a plurality of chips in a multi chip stack.

An apparatus according to an embodiment of the present disclosure relating to the manufacture of stacked semiconductor devices includes a first holding section configured to hold a first semiconductor device and a second holding section configured to hold a second semiconductor device. The first and second holding sections can be controlled to bring a surface of the first semiconductor device into contact with a surface of the second semiconductor device. Additionally, a measuring section including an imaging device for acquiring images of the first and second semiconductor devices and a control section is included. The control section is configured to control the holding sections to correct misalignment between the semiconductor devices. The control section is further configured to determine misalignment using the images of the first and second semiconductor devices when the images include a first alignment mark disposed proximate to an edge of the first semiconductor device and a second alignment mark disposed proximate to an edge of the second semiconductor device.

In a method of using the apparatus, a second semiconductor die is located on the first holder, and a second semiconductor die is placed thereover. The alignment marks located at the upper surface of the first die and lower surface of the second die are imaged from the side of the stack of die, and any misalignment between the alignment marks is recorded. An additional die may be then placed on the second die, and the alignment of the alignment marks of the second and third die is determined and recorded. This may be repeated for multiple die stacked one atop the other. Then, using the alignment (or misalignment) information, the positioning of the holder or of the die being located on the holder or an underlying die is changed, so as to affect better alignment in the next stack of die to be formed.

In general, according to one embodiment, an inspection apparatus for inspecting a semiconductor device with a prescribed number of semiconductor elements laminated or stacked thereon, comprises a first holding section that holds a first semiconductor device having at least one semiconductor element; a second holding section that holds a second semiconductor device having at least one semiconductor element; an inspection section that acquires the images of the first and second semiconductor devices; and a control section that controls the first holding section, the second holding section and the inspection section; wherein the semiconductor element is a rectangular parallelepiped having a quadrangular first plane that has two first sides along a first direction and two second sides along a second direction orthogonal to the first direction and a quadrangular (quadrilateral) second plane that is parallel to the first plane; the first plane has multiple metallic electrodes (metal electrodes) and at least one first alignment mark that comes in contact with the first and second sides in the vicinity of corners that are formed by the first and second sides; and the second plane has multiple solder points and at least one second alignment mark that comes in contact with the first and second sides in the vicinity of corners that are formed by the first and second sides; wherein the first holding section holds the first semiconductor device in such a way that the first plane of the first semiconductor device is exposed; wherein the second holding section holds the second semiconductor device in such a way that the second plane of the second semiconductor device is exposed; and wherein the control section has the following functions that: bonding of the exposed multiple metallic electrodes of the first semiconductor device with the exposed multiple solder points of the second semiconductor device by the first and second holding sections is repeated until a prescribed number of the semiconductor elements is stacked; and after stacking a prescribed number of the semiconductor elements, using the inspection section, along a third direction that is orthogonal to the first and second directions, at each corner of the first and second semiconductor devices, that is formed by the first and second sides, images are acquired for the first and second alignment marks, and this is done for at least two positions of the corners.

First Embodiment 1.1 Configuration

<1.1.1 Configuration of Semiconductor Chip>

Figure 2:
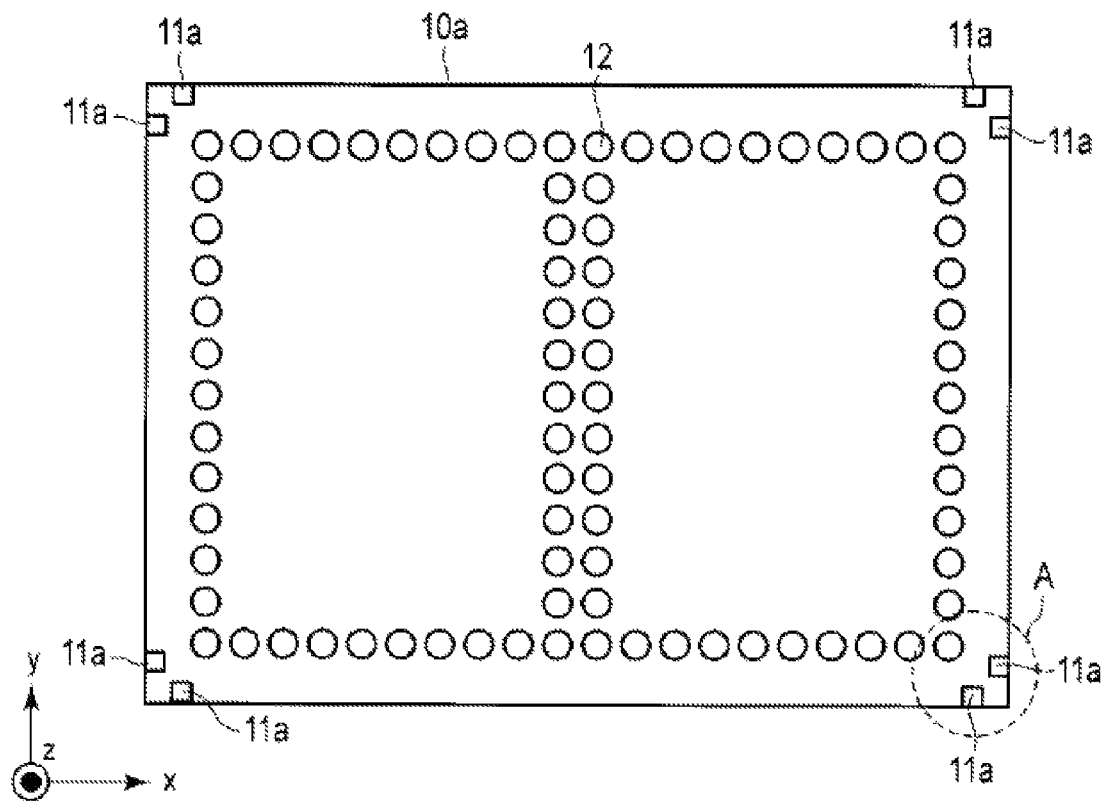
FIG. 2 is a plan view schematically depicting a basic configuration of the upper surface of the semiconductor element according to the first embodiment.
Figure 3:
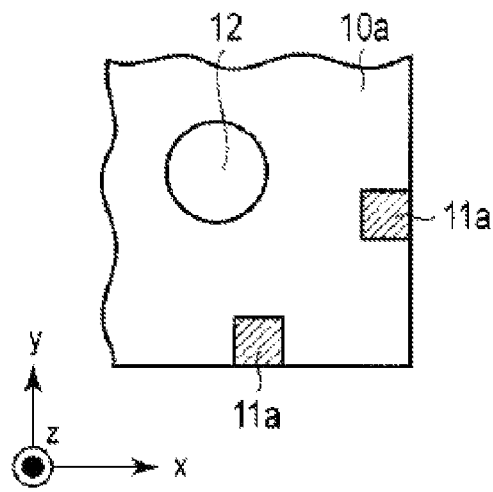
FIG. 3 is an enlarged plan view of the portion of FIG. 2 enclosed by the dashed line A.
Figure 4:
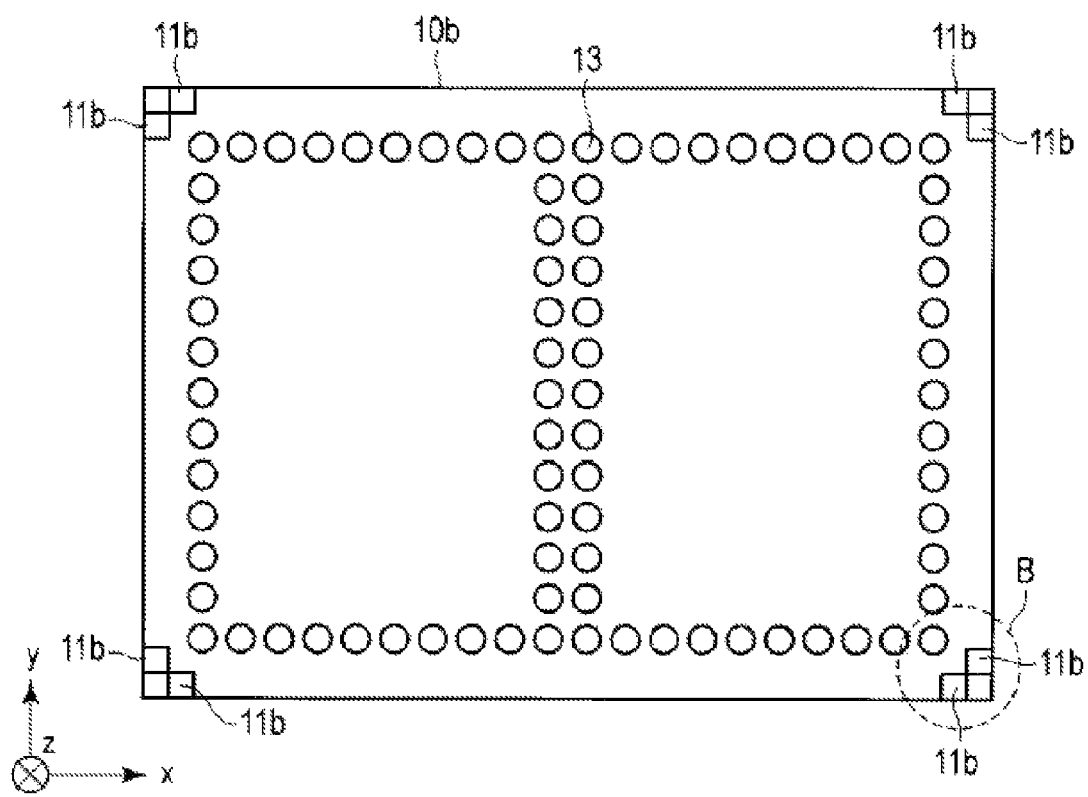
FIG. 4 is a plan view schematically depicting a basic configuration of the bottom surface of the semiconductor element according to the first embodiment.
Figure 5:
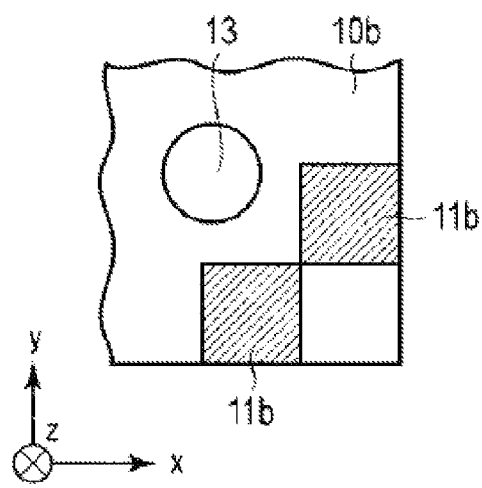
FIG. 5 is an enlarged plan view of the portion of FIG. 4 enclosed by the dashed line B.
Figure 6A:
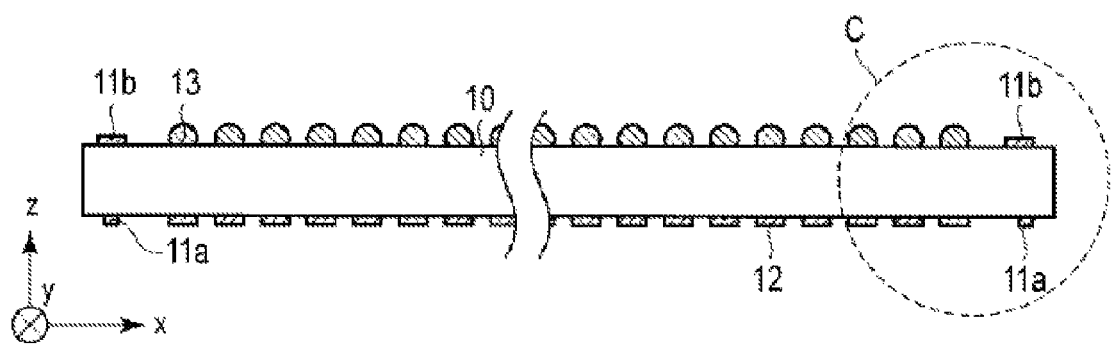
FIG. 6A is a plan view schematically depicting a basic configuration of the side surface along the x-z plane of the semiconductor element according to the first embodiment.
Figure 6B:
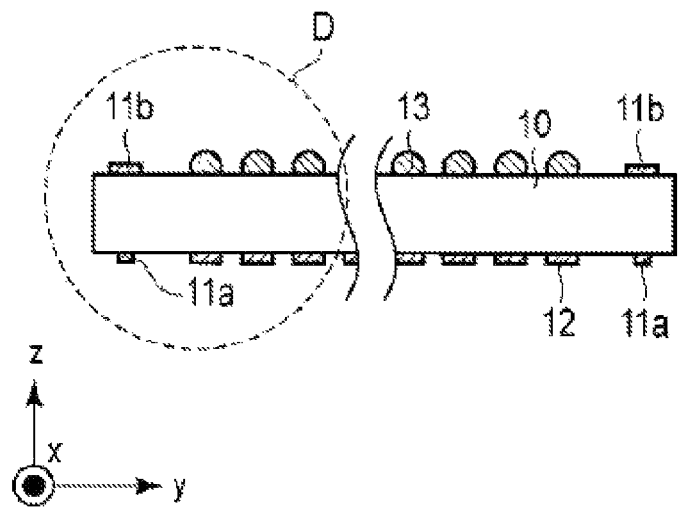
FIG. 6B is a plan view schematically depicting a basic configuration of the side surface along the y-z plane of the semiconductor element according to the first embodiment.
Figure 7A:
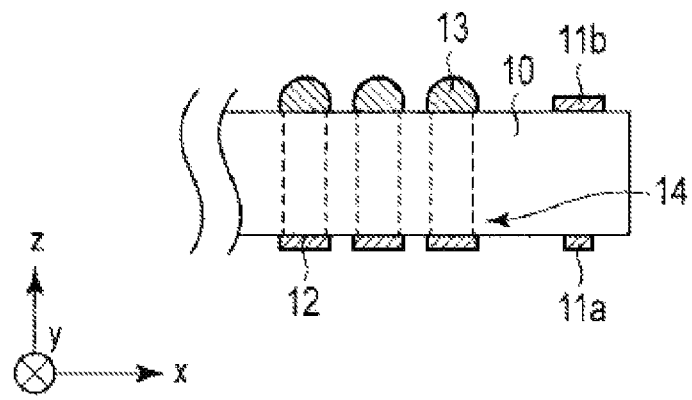
FIG. 7A is an enlarged plan view of the portion of FIG. 6A enclosed by the dashed line C.
Figure 7B:
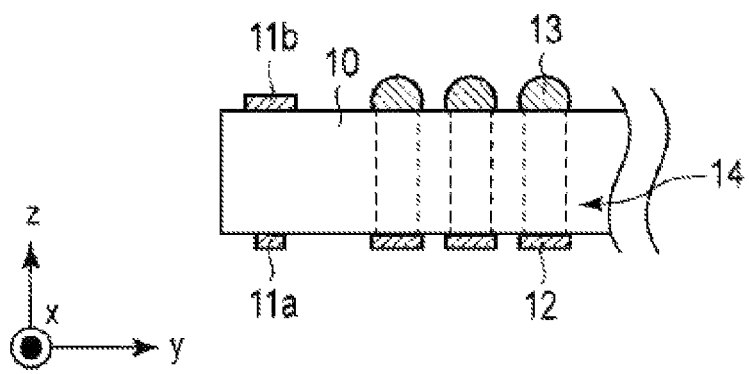
FIG. 7B is an enlarged plan view of the portion of FIG. 6B enclosed by the dashed line D.

The basic configuration of the semiconductor element according to the first embodiment is explained using FIGS. 1 through 7B. FIG. 1 is a perspective view schematically showing a basic configuration of the semiconductor element according to the first embodiment. FIG. 2 is a plan view schematically showing the basic configuration of the upper surface of the semiconductor element according to the first embodiment, and FIG. 3 is an enlarged plan view of the portion of the semiconductor element enclosed by the dashed line A in FIG. 2. FIG. 4 is a plan view schematically showing the basic configuration of the bottom surface of the semiconductor element according to the first embodiment, and FIG. 5 is an enlarged plan view of the portion of the semiconductor element enclosed by the dashed line B in FIG. 4. FIGS. 6A and 6B are plan views schematically showing the basic configuration of the side surface of the semiconductor element according to the first embodiment, and FIGS. 7A and 7B are enlarged plan views of the portions of the semiconductor element enclosed by the dashed lines C and D in FIGS. 6A and 6B, respectively.

As shown in FIG. 1, semiconductor element (also referred to as the semiconductor die or chip) 10 includes an upper surface 10a, which is a quadrangle (quadrilateral) having two sides 10x parallel with the x-axis and two sides 10y parallel with the y-axis that perpendicularly intersects x-axis, and a bottom surface 10b (not shown in the figure). The upper surface 10a and the bottom surface 10b of the semiconductor chip 10 are arranged parallel to the x-y plane and separated from each other along the z-axis direction that is orthogonal to the x-y plane.

As shown in FIG. 2, the upper surface (also referred to as the surface or the metal electrode face) 10a of the semiconductor chip 10 includes multiple metal electrodes 12. The electrodes may be formed of aluminum or the like. Moreover, the upper surface 10a of the semiconductor chip 10 has at least one alignment mark 11a (though two alignment marks are used in this embodiment) in the vicinity of each corner (vertex) formed by the sides 10x and the sides 10y of the quadrilateral (quadrangle). For ease of manufacture, the alignment mark on the upper surface of the chip may be formed of the same material, and at the same time as, the metal electrodes 12.

As shown in FIG. 3, alignment mark 11a is located at the sides 10x and the sides 10y at the outer edge of the upper surface 10a of the chip 10. Furthermore, to inspect misalignment in the X direction and the Y direction of each of the stacked chips between the multiple semiconductor chips 10, and to inspect θ rotational misalignment (also referred as misalignment in the xyz position) of each of the stacked chips in respect to a base chip (typically the lowermost stacked chip is the most appropriate to set as the base chip), it is preferable to employ two or more alignment marks 11a for each corner.

Also, as shown in FIG. 4, multiple solder bumps 13 are set on the bottom surface (also referred to as the rear surface or the bump surface) 10b of the semiconductor chip 10. These solder bumps 13 are set to correspond with the position of metal electrodes 12 set on the upper surface 10a. The solder bump 13 includes an underlying metallization, such as aluminum, over which solder is attached. Furthermore, the bottom surface 10b includes at least one alignment mark 11b in the vicinity of each corner (vertex) formed by the sides 10x and the sides 10y of the quadrangle. These alignment marks may be formed of the same material, and at the same time, as the underlying metallization of the solder bumps 13.

As shown in FIG. 5, this alignment mark 11b is located along the sides 10x and the sides 10y at the outer edge of the bottom surface 10b of chip 10. Furthermore, to inspect the alignment in the X direction and the Y direction of each of the chips among the multiple semiconductor chips 10, and to inspect θ rotational misalignment of each of the chips with respect to the base chip, i.e. the lowermost chip 10, it is preferable to establish or provide two or more alignment marks 11b for each corner of the quadrangle.

As shown in FIGS. 6A to 7B, the film thickness (thickness along the z-axis direction) of the alignment marks 11a and 11b will typically have a thickness of about ⅕ to ⅓ of the thickness of the solder bumps 13. It is generally preferable to have a thickness that does not influence the deformation or collapsing of the solder bumps 13 when the metal electrodes 12 are bonded with the solder bumps 13 of another stacked chip.

The shape of the alignment marks 11a and 11b is, for instance, a quadrangle, and the sizes may differ respectively. The alignment marks 11a and 11b, as shown in FIG. 7A, are set, for instance, on one side of the upper surface 10a and the bottom surface 10b along the x-axis direction. The alignment marks 11a and 11b are formed on opposed sides of the chip 10 along the x-side of the chip 10 in such way that their centers align across the width of the chip. Likewise, the alignment marks 11a and 11b are formed on opposed sides of the chip 10 along the y-side of the chip 10 in such way that their centers align across the width of the chip. By providing the same alignment marks positions and alignments for each chip, the alignment of a second chip 10-2, over a first chip 10-1, may be determined accurately. So long as the alignment marks 11a and 11b possess the size and the film thickness that can be detected by an optical system camera, various alterations in the marks can be made without departing from the scope of the present disclosure. In this embodiment, for instance, the alignment marks 11a and 11b are in the quadrangular shape and the alignment marks are formed with the metallic material, but different shapes, thickness, and materials may be used.

Moreover, as shown in FIG. 7A and FIG. 7B, the metal electrodes 12 and the solder bumps 13 are connected through a contact 14 formed through the full z-thickness of the semiconductor chip 10. This contact 14 is formed by filling metal in a via (contact hole) set in the semiconductor chip 10, for instance; the configuration is such that the contact is connected to a circuit disposed in the semiconductor chip 10.

<1.1.2 Configuration of Semiconductor Device>

Figure 8:
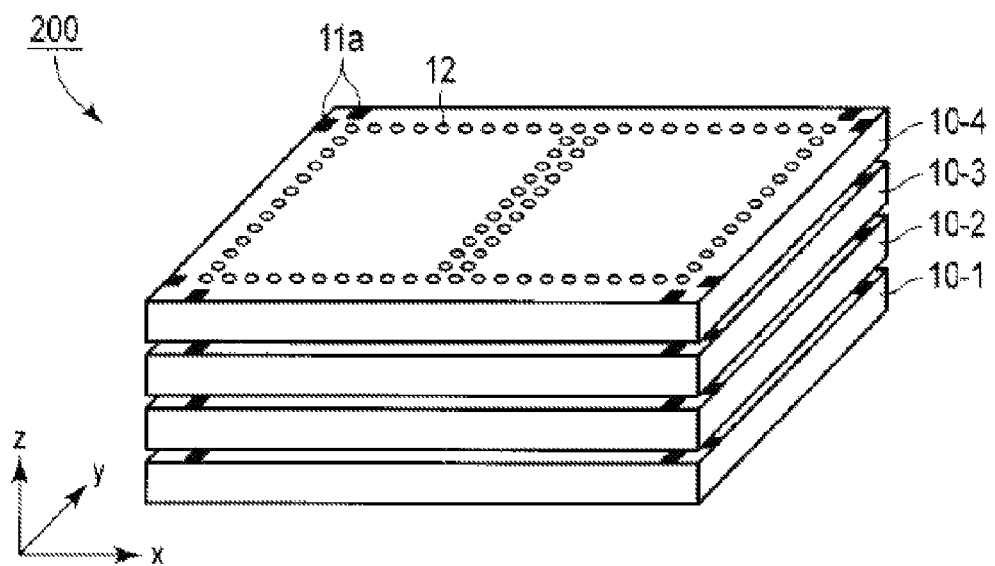
FIG. 8 is an overview schematically depicting a basic configuration of the semiconductor device according to the first embodiment.
Figure 9A:
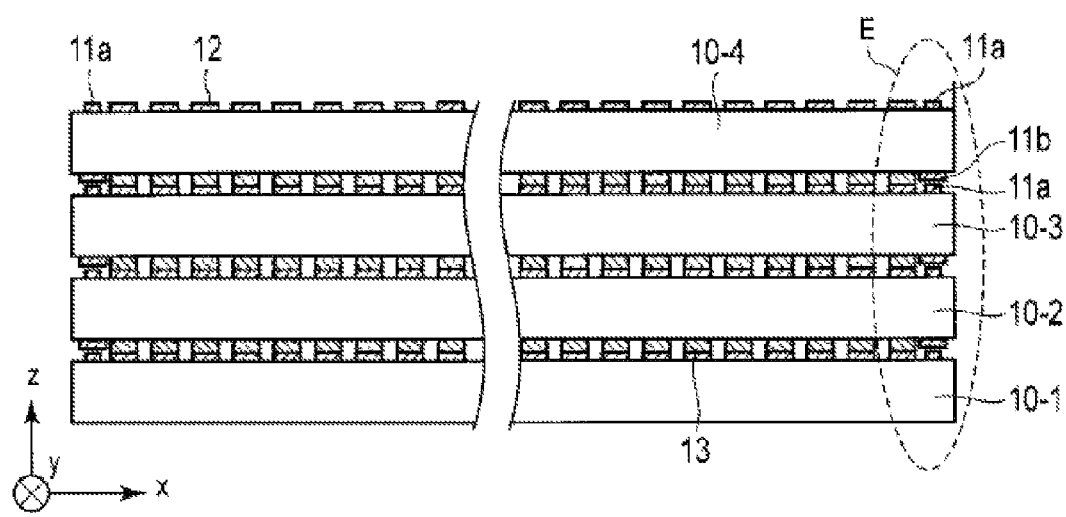
FIG. 9A depicts the semiconductor device shown in FIG. 8 as seen from the x-z plane.
Figure 9B:
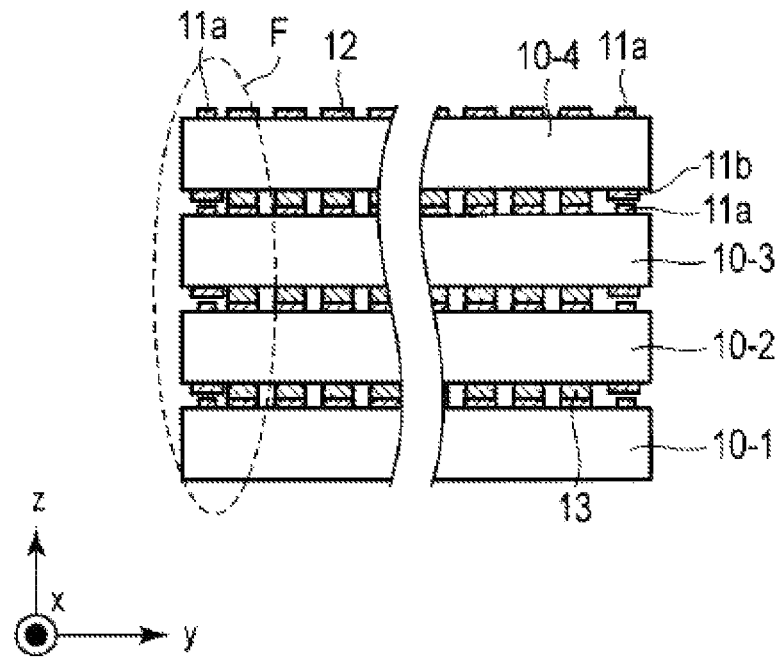
FIG. 9B depicts the semiconductor device shown in FIG. 8 as seen from the y-z plane.
Figure 10A:
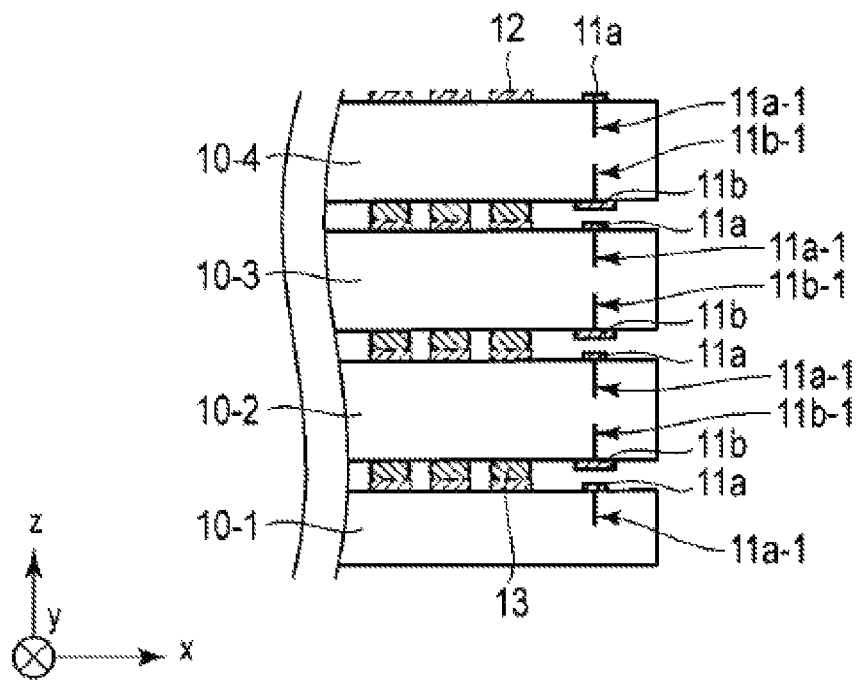
FIG. 10A is an enlarged depiction of a portion of FIG. 9A enclosed by the dashed line E.
Figure 10B:
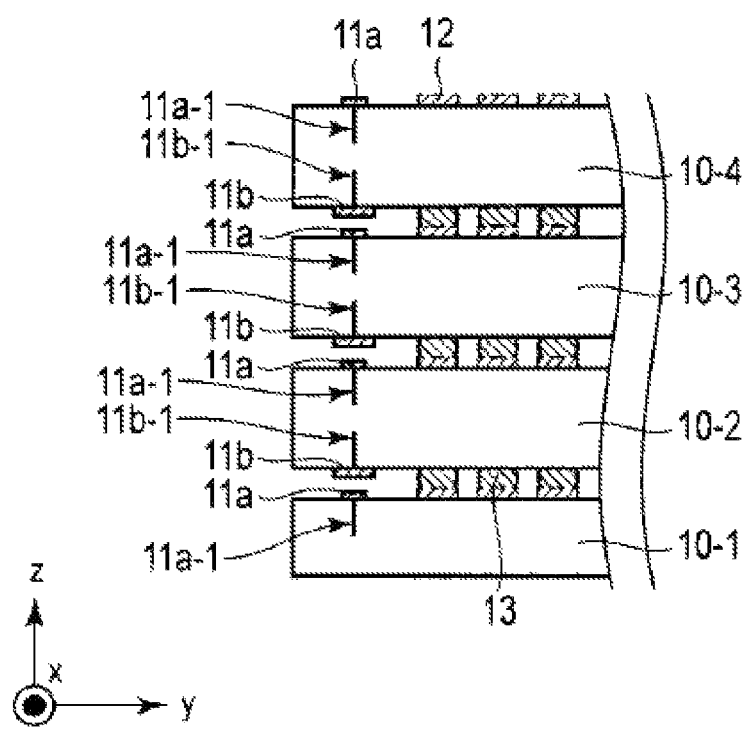
FIG. 10B is an enlarged depiction of a portion of FIG. 9B enclosed by the dashed line F.

Next, the semiconductor device 200 according to this embodiment is explained using FIGS. 8 to 10B. FIG. 8 is the perspective view schematically showing the basic configuration of semiconductor device 200 having a plurality of chips 10-2 to 10-4 stacked one atop the other according to this embodiment. FIG. 9A depicts the semiconductor device 200 shown in FIG. 8 as seen from the x-axis to the z-axis plane. FIG. 9B depicts the semiconductor device 200 shown in FIG. 8 as seen from the y-axis to the z-axis plane. FIGS. 10A and 10B are enlarged views of the portion of the stack within dashed line E area in FIG. 9A and the dashed line F area in FIG. 9B, respectively. Here, for simplification of the explanation, an example wherein four semiconductor chips 10 are laminated together is shown.

As shown in FIG. 8, the semiconductor chips 10-1 to 10-4 are laminated one by one. These stacked chips function as a semiconductor device.

Next, as shown in FIGS. 9A and 9B, the lamination is done in such a way that the solder bumps 13 of semiconductor chip 10-2 are bonded with the metal electrodes 12 of the semiconductor chip 10-1. Similarly, the lamination is done in such a way that the solder bumps 13 of the semiconductor chip 10-3 are bonded with the metal electrodes 12 of the semiconductor chip 10-2. Similarly, the lamination is done in such a way that the solder bumps 13 of the semiconductor chip 10-4 are bonded with the metal electrodes 12 of the semiconductor chip 10-3.

Furthermore, as shown in FIGS. 10A and 10B, when the center line 11a-1 of the alignment mark 11a of the semiconductor chip 10-1 matches, that is overlays linearly in the stack direction with the center line 11b-1 of the alignment mark 11b of the semiconductor chip 10-2, the solder bumps 13 of the semiconductor chip 10-2 are properly aligned with the metal electrodes 12 of the semiconductor chip 10-1. Similarly, when the center line 11a-1 of the alignment mark 11a of the semiconductor chip 10-2 matches the center line 11b-1 of the alignment mark 11b of the semiconductor chip 10-3, the solder bumps 13 of the semiconductor chip 10-3 are properly aligned with the semiconductor chip 10-2. Moreover, when the center line 11a-1 of the alignment mark 11a of the semiconductor chip 10-3 matches the center line 11b-1 of the alignment mark 11b of the semiconductor chip 10-4, the solder bumps 13 of the semiconductor chip 10-4 are properly aligned with the metal electrodes 12 of the semiconductor chip 10-3.

Here, although the explanation is abbreviated for simplification purposes, when the solder bumps 13 of the semiconductor chip 10-2 are properly aligned with the metal electrodes 12 of the semiconductor chip 10-1, the center line 11a-1 of the alignment mark 11a adjacent a corner of the side of the semiconductor chip 10-1 along the y-axis direction of the semiconductor chip 10-1 matches the center line 11b-1 of the alignment mark 11b adjacent the same corner along the side of the semiconductor chip 10-2 along the y-axis direction of the semiconductor chip 10-2.

During alignment and inspection thereof, the gap between each semiconductor chip 10, for instance, will typically be in the range of approximately 10 μm, and the film thickness of the alignment marks 11a and 11b, for instance, should typically be in the range of approximately 1 nm to 2 nm.

<1.1.3 Configuration of the Wafer>

Figure 11:
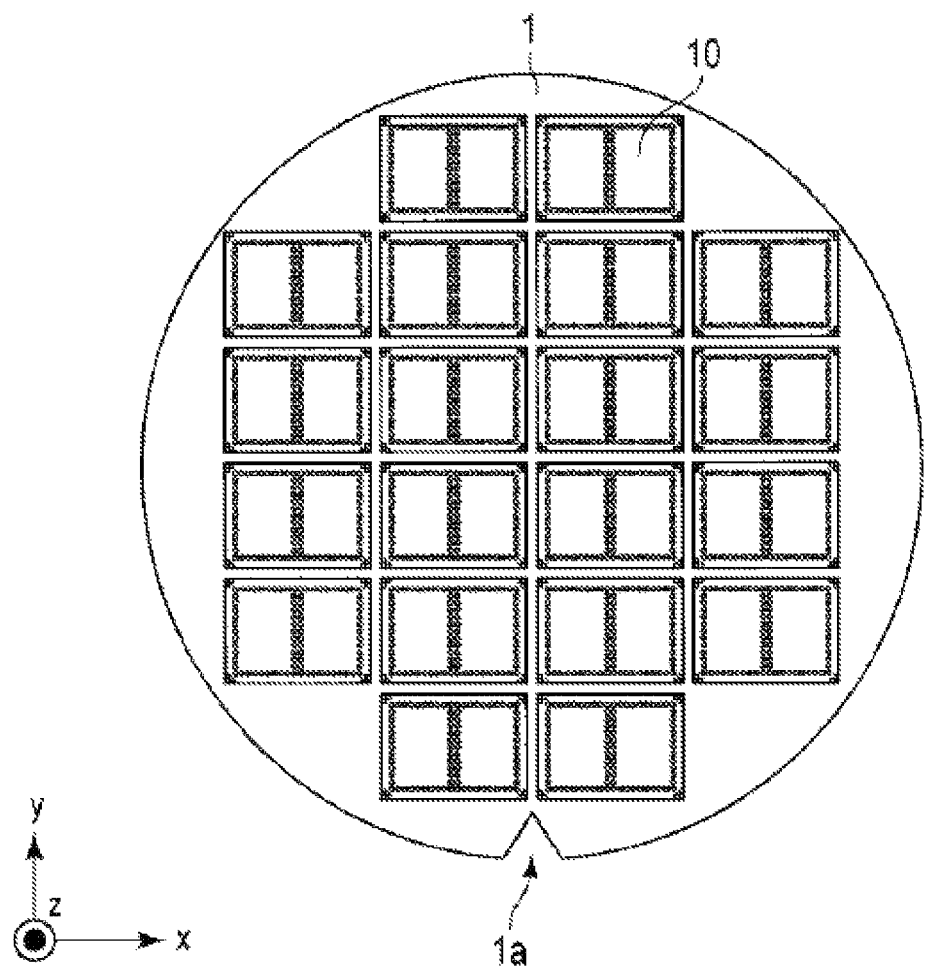
FIG. 11 is a plan view schematically depicting a basic configuration of a plurality of semiconductor elements in wafer form according to the first embodiment.
Figure 12:
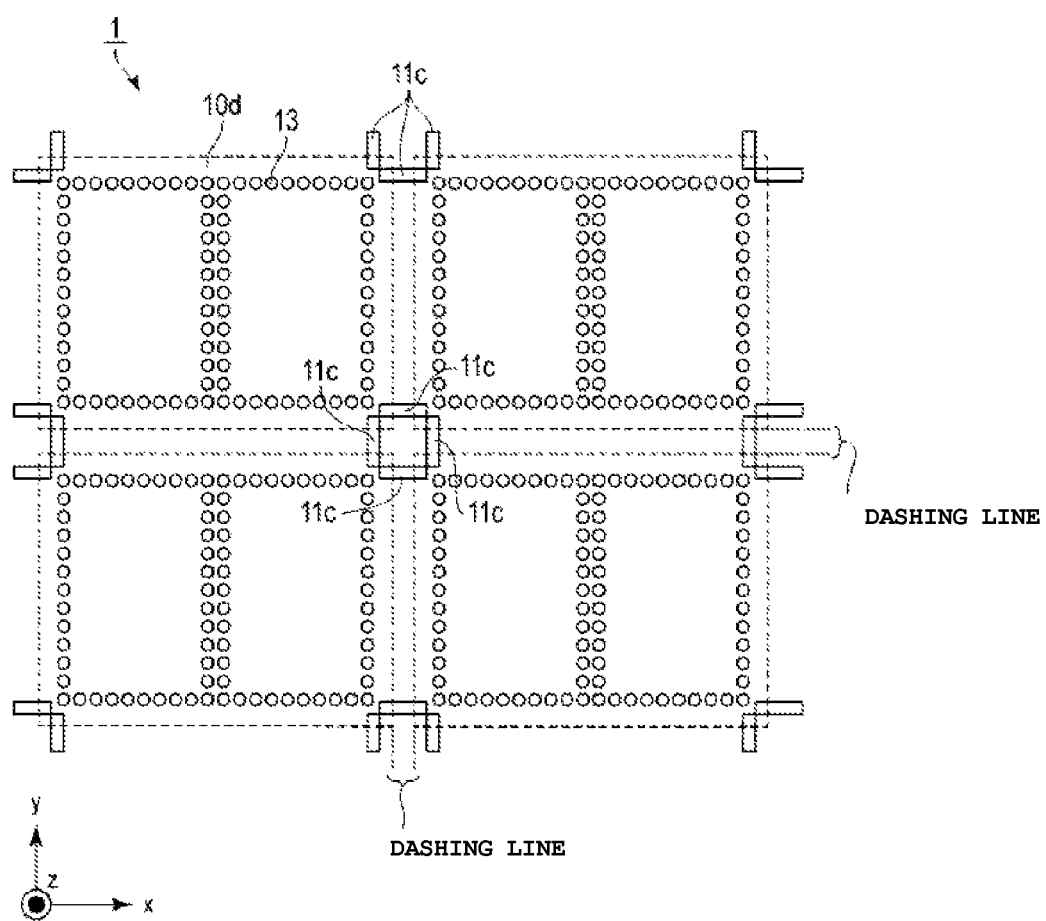
FIG. 12 depicts four semiconductor elements prior to a separation process.

Next, the basic fabrication process of singulation of a plurality of semiconductor elements 10 from a wafer is explained schematically using FIG. 11 and FIG. 12. FIG. 11 is a plan view schematically showing the basic configuration of a plurality of semiconductor elements according to the first embodiment formed on a semiconductor wafer. FIG. 12 depicts four semiconductor elements 10 which were previously singulated from semiconductor wafers. The circuitry of each of the chips 10-1 may be the same or different. For simplification, FIG. 11 and FIG. 12 show the bottom surface 10b of the semiconductor element 10.

As shown in FIG. 11, pre-processing (circuit formation, etc.) is done for a semiconductor wafer 1, and the multiple semiconductor elements 10 are formed on the wafer 1. Furthermore, notch 1a is formed on the semiconductor wafer 1 as the plane direction mark. The region (reserve for cutting) where circuitry is not formed, which is called as dicing line (also referred to as the scribe line), is formed between every area that forms as the semiconductor element 10. The semiconductor element 10 is singulated from the wafer 1 by cutting this area with a dicer, for example. In this embodiment, the alignment marks 11a and 11b are formed on the semiconductor element 10 by depositing strips of an alignment mark material across the scribe area to overly adjacent sides of adjacent chips to be singulated before dicing of semiconductor wafer 1 is carried out. One methodology for forming the alignment mark incorporates the depositing of the alignment mark with the depositing of the sold bump metallization layer (on one side of the wafer) or the electrode metallization layer (on the other side of the wafer. The same process, such as sputtering of a blanket aluminum layer followed by pattern etching through a mask, or depositing aluminum through a mask, can be used to form the alignment marks simultaneously with the other metallizations.

As shown in FIG. 12, alignment mark 11c is formed between two semiconductor elements 10 adjacent to each other in the x-axis direction and the y-axis direction extending over the dicing line. The alignment mark 11c formed on these two semiconductor elements 10 is detached from the semiconductor elements 10 adjacent to each other by the singulation (e.g., dicing) process of the semiconductor elements 10. After the separation process, alignment mark 11c is bifurcated and serves as an alignment mark 11b on the bottom surface 10b of the semiconductor elements or chips 10.

Though not shown in the figure here, the alignment marks 11a is also formed using the similar method. More specifically, the alignment mark, which is formed between two semiconductor elements 10 that are adjacent to each other in the x-axis direction and the y-axis direction extending over the dicing line, is set on the upper surface 10a side of semiconductor 10 as were the alignment marks 11c. Additionally, by carrying out the dicing process, the relevant alignment mark is detached from the semiconductor elements 10 adjacent to each other and the alignment mark 11a is formed on the upper surface 10a of the semiconductor element 10.

Moreover, for instance, the metal electrodes 12 and the solder bumps 13 are formed before singulating the semiconductor element 10 from the wafer.

<1.1.4 Configuration of Inspection Apparatus>

Figure 13:
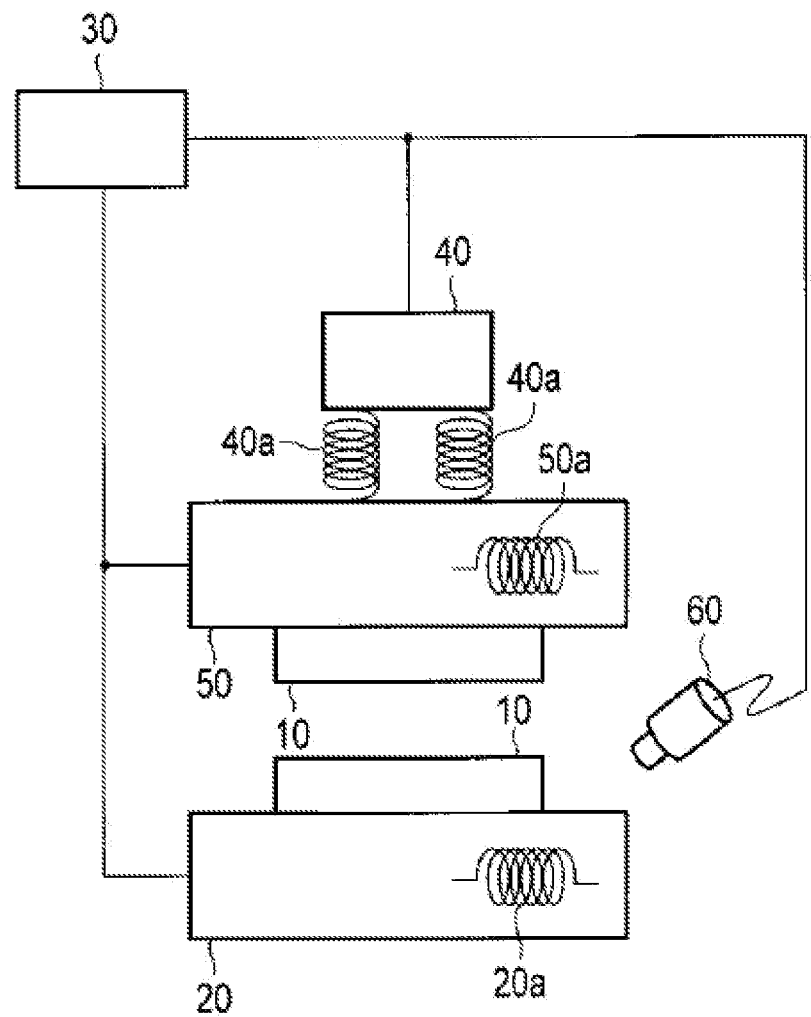
FIG. 13 is a block diagram schematically depicting a basic configuration of the semiconductor manufacturing apparatus according to the first embodiment.

Next, the semiconductor manufacturing apparatus 100 for manufacturing the semiconductor device 200 is explained using FIG. 13. FIG. 13 is a block diagram schematically showing the basic configuration of the semiconductor manufacturing apparatus 100 according to this embodiment. This semiconductor manufacturing apparatus 100 is provided with the mechanism of manufacturing the semiconductor device 200 and inspecting the semiconductor device 200.

As shown in FIG. 13, the semiconductor manufacturing apparatus 100 is provided with stage 20, control section 30, correction section 40, driving section 40a, holding section 50 and measuring section 60.

A semiconductor chip 10 is held by the stage 20. The stage 20 holds the bottom surface 10b of the semiconductor chip 10 in such a way that, for instance, the upper surface 10a side of the semiconductor chip 10 can be bonded to the bottom surface 10b side of a next semiconductor chip 10, which is held by the holding section 50. Based on the control by the control section 30, the stage 20 can appropriately change the x coordinate, y coordinate, z coordinate or θ of the semiconductor chip, or stack of chips, positioned thereon. Moreover, heater 20a is installed in the stage 20 and is used at the time of temporary pressure bonding on the semiconductor chip 10.

The control section 30 is connected to the stage 20, the correction section 40, the driving section 40a, the holding section 50 and the measuring section 60. At the time of bonding, the control section 30 executes the control of the stage 20, the correction section 40, the driving section 40a, the holding section 50, and the measuring section 60. From the coordinates set by the control section 30, pressure bonding is done for the two semiconductor chips 10, which are held respectively by the stage 20 and the holding section 50. Moreover, the control section 30, for instance, possesses a storage section (not depicted in FIG. 13) and can store various correction values.

The correction section 40 (positioning section) is connected to the holding section 50 and possesses the driving section 40a for adjusting the position (bearing) of the semiconductor chip 10 held by holding section 50 (the "upper chip"). Based on the adjustment of the position (bearing) of the chip, and using the driving section 40a, the relative positions of the semiconductor chip 10 that is held by the stage 20 (the "lower chip") and the upper chip are corrected to align one chip properly with the other.

The holding section 50 holds the upper chip that is stacked on the lower chip held by the stage 20. The holding section 50 holds the upper surface 10a side of the upper chip in such a way that, for instance, the bottom surface 10b side of the upper chip bonds with the upper surface 10a side of the lower chip held by the stage 20.

Moreover, x coordinates, y coordinates, z coordinates or θ can be appropriately changed through the correction section 40 and the driving section 40a. Moreover, a heater 50a is installed in the holding section 50 and is used at the time of temporary pressure bonding of the semiconductor chip 10 to another semiconductor chip 10.

The measuring section 60 has a camera to capture images and can also process images and function as an end (length) measurement system. Measuring section 60 has some mechanism for image capturing of the alignment marks in a manner explained in the following description.

In FIG. 13, for simplification purposes, the stage 20 and the holding section 50 may each hold one semiconductor chip 10. However, this embodiment is not limited to the design shown in FIG. 13. In this embodiment, a semiconductor device 200 is formed by bonding or soldering a prescribed number of the semiconductor chips 10 to each other. Specifically, for example, the control section 30 forms the semiconductor device 200 by stacking a prescribed number of the semiconductor chips 10 on the semiconductor chip 10 that is initially held by the stage 20. Therefore, the stage 20 could hold multiple semiconductor chips 10. Similarly, the holding section 50 could hold multiple semiconductor chips 10.

1.2 Operation

Figure 14:
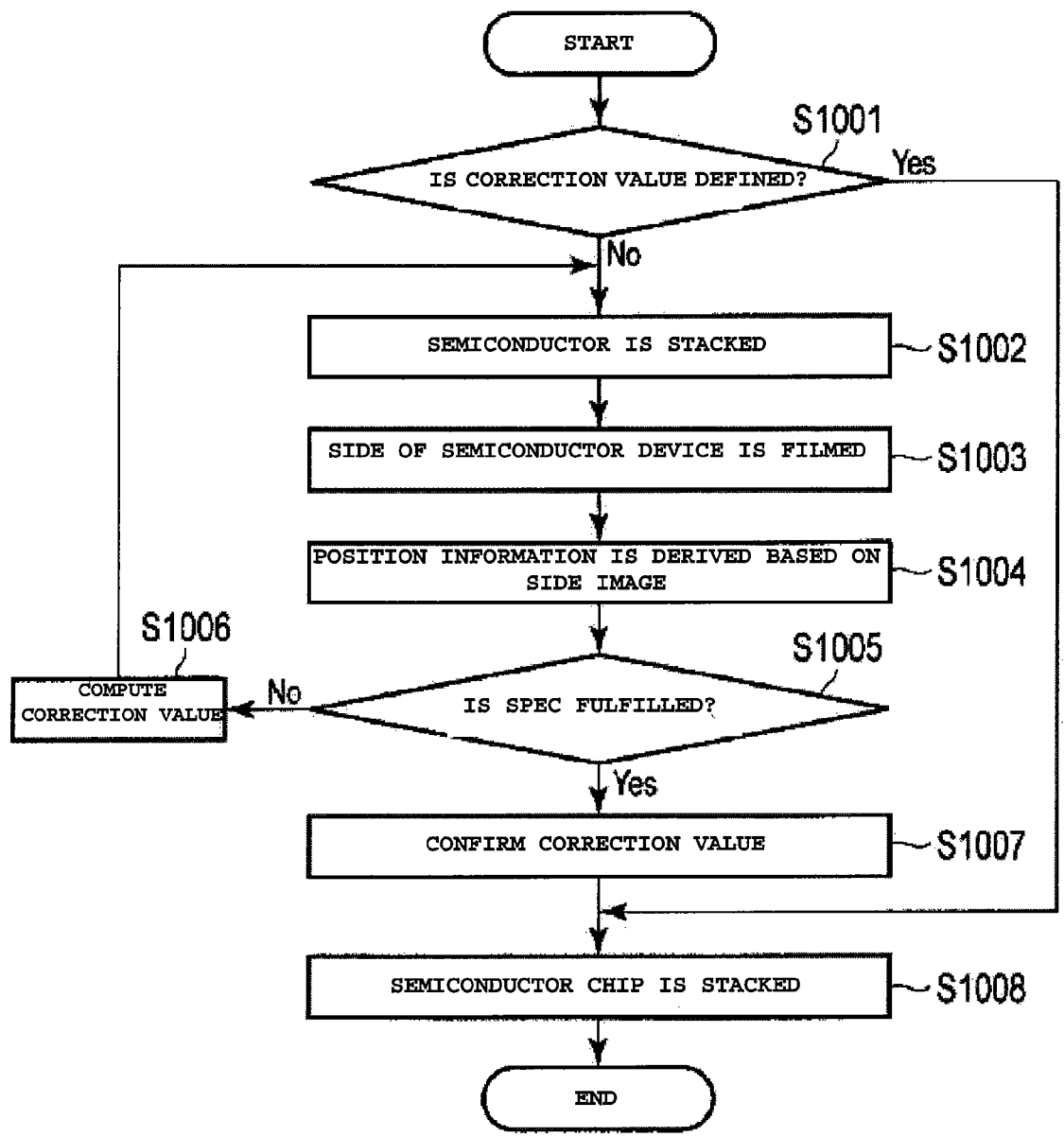
FIG. 14 is a flow chart schematically depicting a basic manufacturing method of semiconductor device according to the first embodiment.

Next, a basic manufacturing method for the semiconductor device 200 according to an embodiment is explained. FIG. 14 is a flow chart showing the sequence of a basic manufacturing method of a semiconductor device 200 according to an embodiment. The method of manufacturing the semiconductor device 200 includes the stacking and bonding together of multiple semiconductor chips 10, as previously explained.

However, while stacking the multiple semiconductor chips, there is a possibility of manufacturing defects being generated because of the operation of the semiconductor manufacturing apparatus 100. Specifically, during use of the apparatus 100, the relative positioning of one substrate on a another can change or drift, resulting in a lateral offset in the x and or y direction, or relative twist in the theta direction, from chip 10 to chip 10 in the stack. This also may occur during the start up of the apparatus, in part because as the apparatus sequentially heats individual chips, thermal expansion induced in the apparatus can cause relative positional changes between the stage 20 and holder 60 resulting in such misalignment. In order to obtain the stacked semiconductor chips 10 with a high dimensional accuracy, it is necessary to correct the manufacturing alignment defects that may be generated.

In a start up mode, or a periodic alignment mode, the apparatus is recalibrated to enable the proper alignment of the chips in the stack. In each case, after stacking and temporarily bonding the multiple semiconductor chips 10 one over the other, the misalignment in the xyz positions is measured in the semiconductor manufacturing apparatus 100 in this embodiment. Thereby, a correction value for the positioning of the chips during stacking is derived, and the misalignment in the xyz positions for each of the semiconductor chips 10 is corrected to position the chips within a tolerance range of positional deviation by the semiconductor manufacturing apparatus 100 before formally starting to manufacture semiconductor devices 200 using the apparatus. In other words, the alignment and inspecting aspects of the apparatus 100 are used to calibrate the apparatus 100 using actual or dummy chips having alignment marks thereon, before volume manufacturing of a device is undertaken. This method is explained in more detail as follows.

[Step S1001]

First, using the control section 30, it is confirmed whether all of the correction values used during the lamination of the semiconductor chips 10 are set (defined) in the control section 30. In this embodiment, it is intended that these correction values are set based on an alignment step, and will not be present at start up of the apparatus or when a the apparatus is switched from the stacking of one device to stacking another device.

[Step S1002]

Following step S1001, when the control section 30 determines that the correction value is not defined (step S1001: No), the alignment mark 11b on the solder bump side 10b of the upper chip and the alignment mark 11a of the metallic electrode on upper surface 10a of the lower chip are imaged, and the coordinates for the stage 20 and the holding section 50 are determined. Next, the semiconductor chips 10 are stacked based on the positioning coordinates. When a temporary correction value is derived in step S1006 that is described later, the control section 30 uses this correction value to correct the position of the holding section 50 before the lamination of the semiconductor chips 10 is carried out.

Specifically, the first semiconductor chip 10 (lower chip) is held in such a way that, in the stage 20, the upper surface 10a with the metallic electrode 12 is bonded to the bottom surface 10b of the semiconductor chip 10 (upper chip) that is held by the holding section 50. Moreover, other semiconductor chips 10 stacked on the semiconductor chip 10 held in the stage 20 are held in such a way that the bottom surface 10b where the solder bump 13 is provided in the holding section 50 is bonded to the upper surface 10a of the semiconductor chip 10 held in the stage 20.

Also, the measuring section 60, for example, images and stores an image of the position of the semiconductor chip 10 held in the stage 20. After this, based on the information obtained from the measuring section 60, the positioning coordinates for the semiconductor chip in the stage 20 are derived by the control section 30. Moreover, the control section 30 determines the positioning coordinates for the metal electrode 12 of the semiconductor chip 10 held in the stage 20 so that the corresponding metal electrode 12 is positioned to engage the solder bump 13 of the substrate to be stacked thereon. Based on the determined positioning coordinates, the control section 30 adjusts the position of the holding section 50 using the correction section 40 and temporarily bonds the semiconductor chip 10 held in the holding section 50 to semiconductor chip 10 held in the stage 20. In this case, by heating the stage 20 and the holding section 50 using the heaters 20a and 50a, it is possible to melt the solder bump 13 of the semiconductor chip 10 to an extent that it can temporarily bond with the metal electrode 12. In this way, by repeating this same process, as shown in FIG. 12, lamination of a semiconductor device with a desired number of chip 10 layers is carried out.

[Step S1003]

Next, the inspection of the alignment marks 11a and 11b formed in the same corner of each semiconductor chip 100 of the sequentially stacked semiconductor device 200 from the side of the semiconductor device 200 is carried out by the measuring section 60. Specifically, in each step, in the semiconductor chip 10, the alignment mark 11b on the solder bump side (bottom surface 10b) of the semiconductor chip 10 and the alignment mark 11a on the upper surface 10a of the semiconductor chip 10 on the opposite side are imaged by the measuring section 60.

In order to calculate the x coordinate, y coordinate and θ position, in each corner, respectively, it is necessary to take an independent measurement of the semiconductor chip 10 along the x-axis side and the semiconductor chip 10 along the y-axis side of the semiconductor chip 10.

Figure 15:
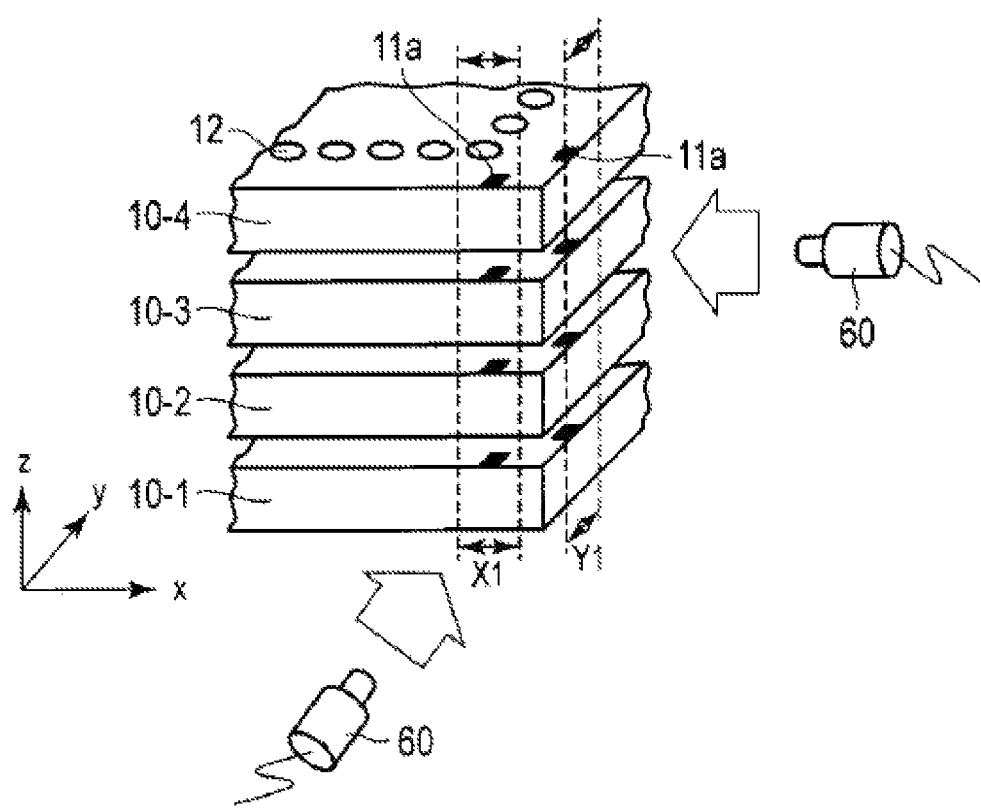
FIG. 15 is an overview depicting a state wherein a measuring section takes images of the semiconductor device according to the first embodiment.

As shown in FIG. 15, the areas along the x-axis (area X1) of the semiconductor chip 10 and along the y-axis (area Y1) of the semiconductor chip 10 are observed by the measuring section 60.

Figure 16:
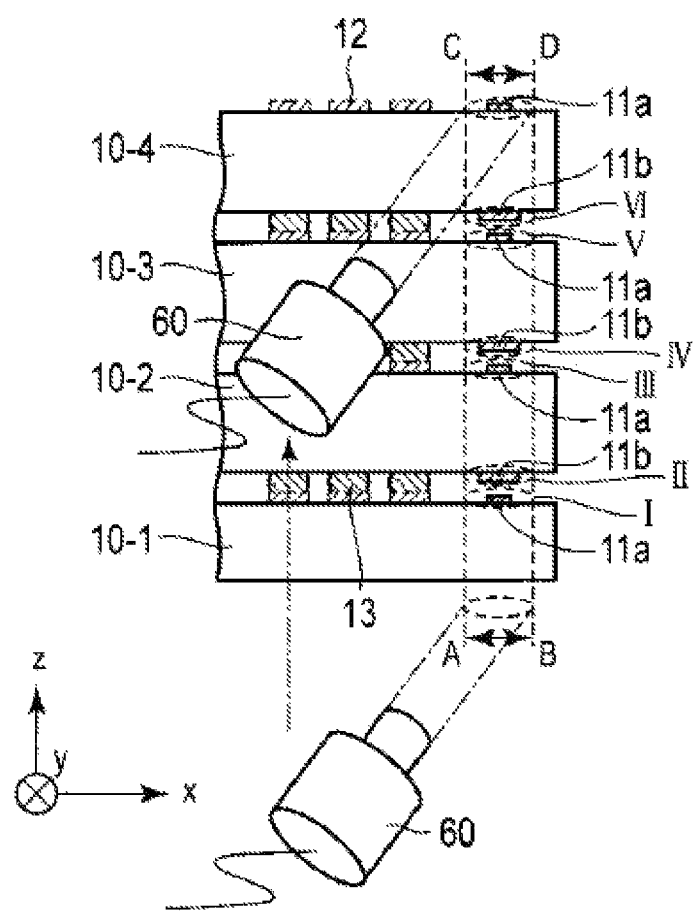
FIG. 16 is an overview depicting the state wherein a measuring section takes images of a semiconductor device according to the first embodiment.

As shown in FIG. 16, for example, when the side of the semiconductor chip 10 along the x-axis is being measured by the measuring section 60, the measurement of area X1 for the alignment marks 11a and 11b on each semiconductor chip 10 is being carried out. Specifically, measurement is carried out sequentially from the alignment mark 11a on the lowermost semiconductor chip 10-1 along the z-axis at a lower position A-B to the alignment mark 11b on the uppermost semiconductor chip 10-4 along the z-axis at a higher position C-D. In addition, the alignment mark 11a on the semiconductor chip 10-1 as shown in I, the alignment mark 11b on the semiconductor chip 10-2 as shown in II, the alignment mark 11a on the semiconductor chip 10-2 as shown in III, the alignment mark 11b on the semiconductor chip 10-3 as shown in IV, the alignment mark 11a on the semiconductor chip 10-3 as shown in V and the alignment mark 11b on the semiconductor chip 10-4 as shown in VI are sequentially measured by the measuring section 60.

Measuring section 60 carries out a similar measurement for the area Y1, and preferably at all corners of semiconductor device 200, or at least for two corners, the measurement previously described is carried out.

[Step S1004]

The control section 30 calculates the misalignment between the semiconductor chips 10 based on the information related to the image, etc. obtained by the measuring section 60.

Next, the basic inspection method of the semiconductor device in this embodiment is explained using FIG. 17 and FIG. 18. FIG. 17 and FIG. 18 are the figures that show the image typically taken by the measuring section 60 by the method described in FIG. 16. Here, for simplicity, only the case when the alignment marks 11a and 11b facing the sides of the semiconductor chips 10 along the x-axis direction is explained.

First, the control section 30 guides the gap along the z-axis direction between each semiconductor chip 10. To be more precise, as shown in FIG. 17, based on the information measured by the corner of the semiconductor device 200, the control section 30 calculates the respective distance (gap) between the upper surface 10a of the semiconductor chip 10-1 and the bottom surface 10b of the semiconductor chip 10-2 (between I and II); between the upper surface 10a of the semiconductor chip 10-2 and the bottom surface 10b of the semiconductor chip 10-3 (between III and IV); and between the upper surface 10a of the semiconductor chip 10-3 and the bottom surface 10b of the semiconductor chip 10-3 (between V and VI).

Next, the control section 30 determines the center position of each alignment mark and, thus, derives position information of the x-axis direction or the y-axis direction. Specifically, as shown in FIG. 18, the control section 30 determines the difference (refer to VII) between the center coordinates (the x coordinates) 11a-1 of the alignment mark 11a of the semiconductor chip 10-1 and the center coordinates (the x coordinates) 11b-1 of the alignment mark 11b of the semiconductor chip 10-2. Similarly, the control section 30 determines the difference (refer to VIII) between the center coordinates (the x coordinates) 11a-1 of the alignment mark 11a of the semiconductor chip 10-2 and the center coordinates (the x coordinates) 11b-1 of the alignment mark 11b of the semiconductor chip 10-3. The control section 30 determines the difference (refer to IX) between the center coordinates (the x coordinates) 11a-1 of the alignment mark 11a of the semiconductor chip 10-3 and the center coordinates (the x coordinates) 11b-1 of the alignment mark 11b of the semiconductor chip 10-4. As a result, the x-misalignment along the x-axis direction between the semiconductor chips 10 can be derived.

Similarly, the misalignment along the y-axis direction between the semiconductor chips 10 and the gap between the semiconductor chips 10 are derived for the alignment marks 11a and 11b facing sides of the semiconductor chips 10 along the y-axis direction.

Moreover, by deriving the misalignment of the x-axis direction, and the misalignment of the y-axis direction from at least two corners of the semiconductor device, the rotational or twist misalignment of θ of each semiconductor chip 10 can also be derived.

[Step S1005]

Next, the control section 30 judges the acceptance or rejection decision for the position and the misalignment along the xyz direction of the individual semiconductor chip 10 based on the inspection result of step S1004 (the position information of each semiconductor chip 10).

Specifically, the control section 30 determines whether the stacked device satisfies device specifications of the semiconductor device 200, wherein the gap between each semiconductor chip 10 along the z-axis direction, and the misalignment of the x-axis direction, the y-axis direction, and θ are predetermined values.

[Step S1006]

When the control section 30 judges that, in step S1005, the semiconductor device 200 does not satisfy the device specifications, the control section 30 derives a temporary correction to correct the misalignment derived by step S1004. Thus, the control section 30 corrects the position of the holding section 50 using this temporary correction value and laminates the semiconductor chip 10 in step S1002 using this temporary correction value.

[Step S1007]

When the control section 30 judges that, in step S1005, the semiconductor device 200 satisfies the device specifications, the control section 30 decides the official correction value used at the time of stacking multiple semiconductor chips 10. For instance, when the semiconductor device 200 meets specifications, the control section 30 sets the correction value in step S1002 as "It is not" since the multiple semiconductor chips 10 are stacked as control section 30 does not use the temporary correction value derived in step S1006. Moreover, in step S1002, the control section 30 laminates the multiple semiconductor chips 10 using the temporary corrected value that is determined in step S1006. As a result, when the semiconductor device 200 satisfies the specifications, the control section 30 sets the temporary corrected value derived in step S1006, as the official corrected value.

[Step S1008]

The control section 30 corrects the position of the holding section 50 using the corrected value decided in step S1007; additionally, lamination of the multiple semiconductor chips 10 is carried out similar to the method explained in step S1002.

As a method variant, the order of step S1001 and step S1002 can be reversed.

1.3 Action and Effect of the First Embodiment

According to the first embodiment, the inspection apparatus (semiconductor manufacturing device) 100 is an apparatus that laminates a prescribed number of the semiconductor elements (semiconductor chips) 10 and inspects the semiconductor device 200. It includes a first semiconductor device having at least one semiconductor element 10, the second semiconductor device having at least one semiconductor element 10, the first holding section (stage) 20 that holds the first semiconductor device 10, the second holding section (stage) 50 that holds the second semiconductor device 10, the inspection section (measuring section) 60 that acquires the image of the first and second semiconductor devices 10, and the control section 30 that controls the first holding section 20, the second holding section 50, and the inspection section 60. The semiconductor element 10 is, in this embodiment, a rectangular parallelepiped having a quadrangular first plane (upper surface 10a) that has two first sides 10x along a first direction (the x-axis direction) and two second sides along a second direction (the y-axis direction) orthogonal to the first direction and a quadrangular second plane (bottom surface 10b) that is parallel to the first plane (upper surface 10a). The first plane (upper surface 10a) has multiple metal electrodes 12 and at least one first alignment mark 11a that comes in contact with the first and second sides in the vicinity of corners (vertices) that are formed by the first and second sides 10x and 10y. The second plane (bottom surface 10b) has multiple solder points (solder bumps) 13 and at least one second alignment mark 11b that comes in contact with the first and second sides in the vicinity of corners that are formed by the first and second sides 10x and 10y. The first holding section 20 holds the first semiconductor device 10 in such a way that the first plane 10a of the first semiconductor device 10 is exposed. The second holding section 50 holds the second semiconductor device 10 in such a way that the second plane (bottom surface 10b) of the second semiconductor device 10 is exposed. Additionally, the control section 30 has the enables bonding of the exposed multiple metal electrodes 12 of the first semiconductor device with the exposed multiple solder points 13 of the second semiconductor device by the first and second holding sections, and repeating this until a prescribed number of the semiconductor elements 10 are stacked. Moreover, after stacking a prescribed number of the semiconductor elements 10, using the inspection section 60, along a third direction (the z-axis direction) that is orthogonal to the first and second directions, at each corner of the first and second semiconductor devices 10, that is formed by the first and second sides 10x and 10y, images are acquired for the first and second alignment marks, and this is done for at least two of the corners. At the control section 30, based on images acquired by the inspection section 60, a first distance along the third direction between the multiple semiconductor elements of the semiconductor device 200 is measured, and a misalignment between the first and second alignment marks for the first and second semiconductor devices are measured. Further at the control section 30, it is determined whether the first distance and the misalignment values meet prescribed requirements, and when it is determined that the first distance and the misalignment values do not meet the prescribed requirements, the control section 30 determines a correction value to adjust first distance and the misalignment so that they meet the prescribed requirements. Then, at the control section 30, using the correction value, lamination of the first and second semiconductor devices is carried out, and when the first distance and the misalignment values meet the prescribed requirements, the control section 30 sets the first correction value as a second correction value in the control section 30. When the second correction value is not set in the control section 30, the images for the first and second alignment marks of the semiconductor device 200 are acquired by the inspection section 60, and when the second correction value is set in the control section 30, lamination of the first and second semiconductor devices is carried out by using the second correction value.

Thus, in this embodiment, even in the semiconductor device wherein the multiple semiconductor chips are stacked, from the side surface of the semiconductor chip (the x-z plane or the y-z plane), the gap of the xyz direction can be very well recognized by taking a image of the alignment marks of the inspection section.

Where the alignment marks do not reach the outer side of the semiconductor chip, to correct the misalignment caused in the semiconductor manufacturing apparatus, it is necessary to measure the misalignment of the xyz position after stacking multiple semiconductor chips. For this case, after multiple semiconductor chips are stacked, the x-y plane of the semiconductor device is measured using a transmissive investigating device, such as an infrared microscope. Alignment marks of the semiconductor element side of each step are investigated, and the gap of the xyz position of the semiconductor element is examined. When the semiconductor chips are stacked in more than two steps, the alignment marks of the semiconductor element in each step overlap, and it becomes difficult to specify the xyz position relation of each semiconductor chip.

In this embodiment, the alignment marks of the semiconductor chip are located on the outer edge of the semiconductor chip so that they can be recognized by a camera. Additionally, the image of the alignment marks of each semiconductor chip in the semiconductor device is individually taken, and inspections such as length measurement, etc. are carried out. Thus, the control section can understand the position relation of each semiconductor chip, and it can judge whether the misalignment is present or absent based on the specification standards.

The semiconductor manufacturing apparatus 100 of this embodiment observes the alignment marks set on each semiconductor chip from the side directions and thereby detects the xyz position of each semiconductor chip in the semiconductor device. Therefore, in the semiconductor device wherein two or more semiconductor chips are stacked, it is possible to correctly understand the position relation of each semiconductor chip, and the correction value to overcome misalignment caused by the semiconductor manufacturing apparatus can be correctly derived. As a result, a high-quality semiconductor device can be manufactured wherein the xyz misalignment of each semiconductor chip can be controlled.

Second Embodiment

Next, the semiconductor manufacturing apparatus 100 in a second embodiment is explained. Since the basic structure and operation of the semiconductor manufacturing apparatus 100 is the same as the device explained in the first embodiment, the duplicative details of the explanation have been omitted.

Figure 19A:
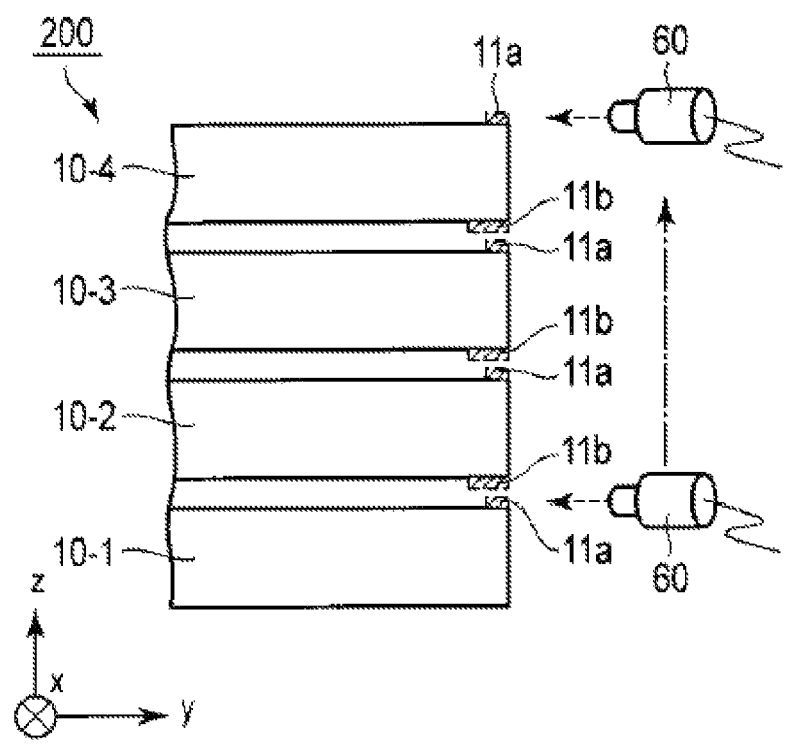
FIG. 19A is a cross-sectional view of the semiconductor device in a case wherein an inspection angle of a measuring section according to a second embodiment is 0° for the x-axis-y-axis plane of the semiconductor chip.
Figure 20:
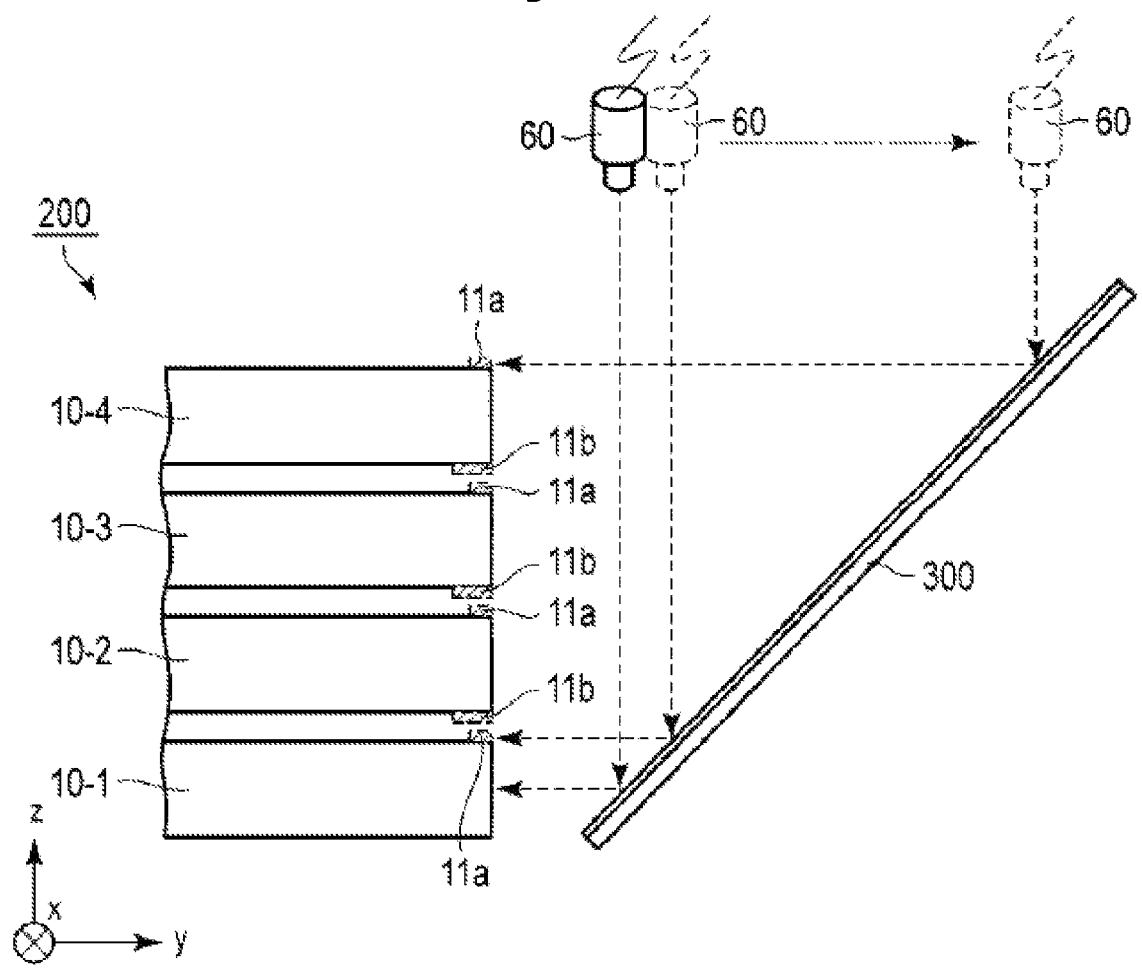
FIG. 20 is a cross-sectional view of the semiconductor device when a reflector is arranged at the side surface of a semiconductor device according to the second embodiment.

A method of imaging the semiconductor device 200 performed by the measuring section 60 in the second embodiment is explained using FIGS. 19A to 20. FIG. 19A is a cross-sectional diagram of the semiconductor device 200, which shows the case wherein the inspection angle of the measuring section 60 is 0° along the x-axis to the y-axis of the semiconductor chip 10. FIG. 19B is the cross-sectional diagram of the semiconductor device 200, which shows the case wherein the inspection angle of the measuring section 60 is 60° along the x-axis to y-axis of the semiconductor chip 10. FIG. 20 is the cross-sectional diagram of the semiconductor device 200, which shows the case wherein reflector 300 is placed to the side of the semiconductor device 200 in the second embodiment and measuring section acquires images via a reflection.

2.1 Inspection Angle of the Measuring Section 60

As shown in FIG. 19A and FIG. 19B, in the inspection of the semiconductor device 200 of step S1003 explained by FIG. 14 of the first embodiment, the measuring section 60 can carry out inspection by suitably changing the inspection angle of the measuring section 60 in the range of 0° to 60° along the side of each semiconductor chip 10-1 to 10-4. Here, though the inspection angle of the measuring section 60 is set to 0° to 60°, the inspection angle should be such that the alignment marks 11a and 11b can be on the semiconductor chips 10-1 to 10-4 can be imaged.

2.2 Reflectors 300

Moreover, the semiconductor manufacturing apparatus 100 is provided with a reflector 300 arranged on the side of the semiconductor device 200, as shown in FIG. 20. Additionally, by means of the reflector 300, the side of the semiconductor device 200 can be checked by the measuring section 60 in the upward and downward directions, i.e., the camera which is used to image the alignment marks may be disposed at a viewing angle which is perpendicular to the plane of the semiconductor chips 10-1 to 10-4. More specifically, by inspecting the semiconductor device 200 by step S1003 as explained in FIG. 14 of the first embodiment, the image that is reflected with the reflector 300 can be acquired and inspected by the measuring section 60. For this reason, it is better if the measuring section 60 possesses a mechanism that allows it to move in only one plane (for example, in the x-y plane), and there is no need to possess a mechanism to directly image the side of the semiconductor device 200 (the x-z plane or the y-z plane).

Moreover, if the reflector 300 appropriately reflects the side of the semiconductor device 200, anyone is acceptable. The method of arrangement of the reflector 300 can be changed appropriately, and any arrangement is acceptable as long as it is possible to inspect the alignment marks 11a and 11b that are present on the semiconductor chips 10-1 to 10-4.

2.3 Action and Effect of the Second Embodiment

In the second embodiment, there is an angle of 0° to 60° in the first and second planes of the semiconductor element 10, so the measuring section 60 can acquire an image of the first and second alignment marks of the semiconductor device 200. Moreover, the semiconductor manufacturing apparatus 100 is provided with the reflector 300 arranged such that reflection for a third plane along the first and third directions or the second and third directions of the first and second semiconductor devices can be acquired, and the measuring section 60 can acquire the image of the first and second alignment marks of the first and second semiconductor devices by the reflector 300.

In this way, the inspection of the alignment mark of the semiconductor chip is carried out, by inspecting the alignment marks formed on the upper and lower surfaces of the semiconductor chip with a camera or imaging apparatus set to a fixed angle with respect to the x-y plane. As a result, the distance between the edge of the semiconductor chip and the near and far edge of the alignment mark can be viewed; furthermore, the relative position between the semiconductor chips can be easily understood. Additionally, for the x-y plane of the semiconductor chip, by imaging the semiconductor chip taken from a fixed angle such as 60 degrees as shown in FIG. 19b he, the space required by the measuring section 60 for carrying out the inspection can be reduced. Similarly, by using the reflector 300, it is possible to greater reduce the size of the arrangement of the measuring section 60; thus, it is possible to reduce the size of the semiconductor manufacturing apparatus.

Modification Example

If the alignment mark of the semiconductor chip faces the outer surface of the semiconductor chip, the inspection method can be achieved, and any type is acceptable.

Moreover, in the semiconductor chip described in the first embodiment, the alignment mark placed on the upper surface 10a of the semiconductor chip 10 is smaller than the alignment mark placed on the bottom surface 10b of the semiconductor chip 10. However, it is not necessarily limited to this configuration; for example, the alignment mark placed on the upper surface 10a of the semiconductor chip 10 can be larger than the alignment mark placed on the bottom surface 10b of the semiconductor chip 10. The differences in the respective sizes of the alignment marks placed on the upper surface 10a and the bottom surface 10b facilitate the judgment of which is the upper surface 10a and which is the bottom surface 10b of a chip 10 when the alignment marks are viewed from the measuring section, etc.

Moreover, even though the four stacked semiconductor chip 10 stack has been described in this embodiment, there can be any number of layers of chips so long as a viable semiconductor device can be fabricated.

Additionally, the numbers and the arrangements of the metal electrode 12 and the solder bump 13 explained in this embodiment are just an example and not limited to this configuration, as there can be a change in this as well.

While certain embodiments have been described, these embodiments have been presented by way of example only, and they are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An apparatus, comprising:
    a first holder configured to hold a first semiconductor device having a first alignment mark disposed proximate to an edge thereof;
    a second holder configured to hold a second semiconductor device having a second alignment mark disposed proximate to an edge thereof;
    an imaging device configured to acquire an image of sides of the first and second semiconductor devices in which the sides of the first and second semiconductor devices and the first and second alignment marks are depicted; and
    a controller configured to determine a misalignment between the first semiconductor device and the second semiconductor devices based on the image and cause the misalignment to be corrected.

2. The apparatus of claim 1, further comprising:
    a driver configured to position the first and second holders with respect to one another based upon a correction value derived from a previously determined misalignment between the first and second semiconductor devices.

3. The apparatus of claim 1, wherein the imaging device is configured to use light of a visible wavelength to acquire the image of the first and second semiconductor devices.

4. The apparatus of claim 1, wherein the semiconductor elements have an upper surface and a lower surface that have a quadrilateral shape.

5. The apparatus of claim 1, wherein the imaging device is inclined from a plane substantially parallel to major surfaces of the first semiconductor device and the second semiconductor device by an angle between approximately zero and sixty degrees, and the first and second alignment marks protrude respectively from the major surfaces of the first and second semiconductor devices so as to be within a field of view of the imaging device.

6. The apparatus of claim 1, further comprising:
a reflector by which the imaging device acquires the image of the first and second semiconductor devices by reflection.

7. The apparatus of claim 1, wherein the first holder includes a heater.

8. The apparatus of claim 1, wherein the second holder includes a heater.

9. The apparatus of claim 1, wherein the second holder is configured to position the second semiconductor device to be in contact with the first semiconductor device for bonding the first and second semiconductor devices to each other.

10. The apparatus of claim 1, wherein the controller is configured to calculate a correction value based on a plurality of images of the first and second semiconductor devices.

11. An apparatus, comprising:
a first holder configured to hold a first semiconductor device having a first alignment mark disposed proximate to an edge thereof;
a second holder configured to hold a second semiconductor device having a second alignment mark disposed proximate to an edge thereof;
an imaging device configured to acquire an image of sides of the first and second semiconductor devices in which the sides of the first and second semiconductor devices and the first and second alignment marks are depicted; and
a controller configured to control the first holder, the second holder, and the imaging device;
wherein
each of the first and second semiconductor devices is a rectangular parallelepiped having an upper surface, a first edge along a first direction, a second edge along a second direction orthogonal to the first direction, and a lower surface parallel to the upper surface;
the upper surface of the first semiconductor device has a plurality of metal electrodes and the first alignment mark disposed thereon;
the first alignment mark is in contact with the first edge proximate to a vertex formed by the first and second edges;
the lower surface of the second semiconductor device has a plurality of solder points and the second alignment mark disposed thereon;
the second alignment mark is in contact with the first edge proximate to the vertex formed by the first and second edges;
the first holder is configured to hold the first semiconductor device to expose the upper surface of the first semiconductor device;
the second holder is configured to hold the second semiconductor device to expose the lower surface of the second semiconductor device;
the controller is configured to cause the metal electrodes of the first semiconductor device to be bonded with the solder points of the second semiconductor device; and
the controller is configured to control the imaging device to acquire the image of the first and second semiconductor devices.

12. The apparatus of claim 11, wherein each of the first and second semiconductor devices further includes:
a third edge along the first direction and a fourth edge along the second direction,
an upper alignment mark disposed proximate to each vertex of the upper surface and contacting one of the edges, and
a lower alignment mark disposed proximate to each vertex of the upper surface and contacting one of the edges, and wherein
the controller is configured to control the imaging device to acquire an image including the upper alignment mark and the lower alignment mark along two or more edges.

13. The apparatus of claim 11, wherein the imaging device is configured to acquire the image of the first and second semiconductor devices at an angle of inclination of 0° to 60° to a plane parallel to the upper and lower surfaces of the first and second semiconductor devices.

14. The apparatus according of claim 11, further comprising:
a reflector disposed to allow the imaging device to acquire the image of the first and second semiconductor devices by reflection.

15. The apparatus of claim 11, wherein the controller is configured to calculate:
a first distance along a third direction, orthogonal to the first and second directions, between the first and second semiconductor devices, and
a misalignment between first and second semiconductor devices based on the image of the first and second semiconductor devices.

16. The apparatus of claim 15, wherein
the controller is further configured to determine whether the first distance and the misalignment meet a prescribed condition.

17. The apparatus of claim 15, wherein the controller is configured to calculate a first correction value for meeting the prescribed condition when it is determined that the first distance and the misalignment do not meet the prescribed condition.

18. The apparatus of claim 15, wherein the controller is further configured to correct the first distance and the misalignment by controlling relative positions of the first and second holders when the prescribed condition is not met.

19. A method of bonding semiconductor devices, comprising:
obtaining a first semiconductor device including a plurality of electrodes disposed on a first surface of the first semiconductor device and a first alignment mark disposed on the first surface proximate to an edge of the first surface;
obtaining a second semiconductor device including a plurality of solder points disposed on a second surface of the second semiconductor device and a second alignment mark disposed on the second surface proximate to an edge of the second surface;
loading the first semiconductor device in a first holder with the first surface exposed;
loading the second semiconductor device in a second holder with the second surface exposed;
placing the first surface in contact with second surface;
acquiring an image of sides of the first and second semiconductor devices in which the sides of the first and second semiconductor devices and the first and second alignment marks are depicted;
determining whether a correction value for positioning the two semiconductor devices is stored;
if no correction value is stored, determining a misalignment between the first semiconductor device and the second semiconductor device using the acquired image and storing a value required to correct the misalignment as the correction value and
positioning the first holder to correct the misalignment if the misalignment is determined to exist; and if the correction value is stored, positioning the first holder to correct the misalignment.

20. The method of claim 19, wherein the image of the first and second semiconductor devices is acquired by reflection using a reflector disposed to a side of the first and second semiconductor devices.

\* \* \* \* \*